(12) United States Patent
Hieda et al.

(10) Patent No.: US 6,737,724 B2
(45) Date of Patent: May 18, 2004

(54) SEMICONDUCTOR DEVICE AND METHOD OF MANUFACTURING THE SAME

(75) Inventors: Katsuhiko Hieda, Yokohama (JP); Kyoichi Suguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/267,689

(22) Filed: Oct. 10, 2002

(65) Prior Publication Data

US 2003/0047763 A1 Mar. 13, 2003

Related U.S. Application Data

(62) Division of application No. 09/512,320, filed on Feb. 24, 2000, now Pat. No. 6,482,714.

(30) Foreign Application Priority Data

Feb. 24, 1999 (JP) .......................................... 11-046389

(51) Int. Cl.[7] .................... H01L 29/00; H01L 29/74; H01L 29/76; H01L 21/76; H01L 21/8238
(52) U.S. Cl. .................... 257/519; 257/124; 257/399; 257/556; 438/416; 438/199
(58) Field of Search .................... 438/199, 416; 257/124, 543, 556, 351, 347, 350, 349, 341, 352, 354, 510, 374, 396, 398, 399, 400, 337, 519

(56) References Cited

U.S. PATENT DOCUMENTS

| | | | |
|---|---|---|---|
| 4,619,033 A | 10/1986 | Jastrzebski | 29/571 |
| 5,229,307 A | 7/1993 | Vora et al. | 437/31 |
| 5,780,896 A | 7/1998 | Ono | 257/344 |
| 5,899,714 A | 5/1999 | Farrenkopf et al. | 438/202 |
| 5,930,643 A | 7/1999 | Sadana et al. | 438/407 |
| 6,020,239 A * | 2/2000 | Gambino et al. | 438/269 |
| 6,064,105 A | 5/2000 | Li et al. | 257/510 |
| 6,071,767 A | 6/2000 | Monkowski et al. | 438/202 |
| 6,130,458 A | 10/2000 | Takagi et al. | 257/351 |
| 6,169,310 B1 | 1/2001 | Kalnitsky et al. | 257/355 |
| 6,184,099 B1 | 2/2001 | Bergemont et al. | 438/305 |
| 2002/0000635 A1 * | 1/2002 | Liu | 257/509 |

FOREIGN PATENT DOCUMENTS

JP 08078515 A 3/1996 ........... H01L/21/76

OTHER PUBLICATIONS

Aoki, M. et al., "0.1μm CMOS Devices Using Low–Impurity–Channel Transistors (LICT)", *IEDM Technical Digest, International Electron Devices Meeting*, pp. 939–941 (1990).

Ohguro, T. et al., "Undoped Epitaxial Si Channel n–MOSFET Grown by UHV–CVD with Preheating," *IEEE Transactions on Electron Devices*, vol. 45, No. 3, pp. 710–716 (1998).

Ohguro, T. et al., "Tenth Micron P–MOSFET'S With Ultra–Thin Epitaxial Channel Layer Grown By Ultra–High–Vacuum CVD", *IEDM Technical Digest*, pp. 433–436 (1993).

\* cited by examiner

*Primary Examiner*—Caridad Everhart
*Assistant Examiner*—Chuong Luu
(74) *Attorney, Agent, or Firm*—Finnegan, Henderson, Farabow, Garrett & Dunner, L.L.P.

(57) ABSTRACT

Disclosed is a semiconductor device including a transistor structure including an epitaxial silicon layer formed on a main surface of an n-type semiconductor substrate, source-drain diffusion layers formed on at least the epitaxial silicon layer, a channel region formed between the source and drain regions, and a gate electrode formed on the channel region with a gate insulating film interposed therebetween, an element isolation region being sandwiched between adjacent transistor structures, wherein a punch-through stopper layer formed in a lower portion of the channel region has an impurity concentration higher than that of the channel region, and the source-drain diffusion layers do not extend to overlap with edge portion of insulating films for the element isolation.

12 Claims, 9 Drawing Sheets

SEMICONDUCTOR DEVICE AND METHOD OF MANUFACTURING THE SAME

This is a Division of Ser. No. 09/512,320 filed Feb. 24, 2000 now U.S. Pat. No. 6,482,714.

CROSS-REFERENCE TO RELATED APPLICATION

This application is based upon-and claims the benefit of priority from the prior Japanese Patent Application No. 11-046389, filed Feb. 24, 1999, the entire contents of which are incorporated herein by reference.

BACKGROUND OF THE INVENTION

The present invention relates to a semiconductor device having a transistor structure in which a punch-through stopper layer is formed mainly within a semiconductor substrate so as to lower the impurity concentration in the channel region and a method of manufacturing the same.

In order to improve the performance of a semiconductor device having a MOS structure, it is very important to achieve a high performance of the MOS transistor. The high performance of the MOS transistor represents, for example, (1) increase in the driving current, (2) reduction in the nonuniformity of the threshold voltage, and (3) reduction in parasitic resistance/parasitic capacitance. The increase in the driving capability has been achieved by shortening the gate length (or channel length). However, if the channel is shortened, the threshold voltage $V_{th}$ is lowered by punch-through, leading to an increase in a so-called "short channel effect" that the threshold voltage cannot be controlled by the gate electrode.

In order to suppress the short-channel effect, efforts have been made to make the thickness of the gate insulating film as thin as possible and to increase the impurity concentration in the channel region to about $10^8$ cm$^{-3}$. However, it is impossible to decrease the thickness of the gate oxide film beyond the maximum electric field because of the restriction imposed by the maximum allowable electric field $E_{max}$ capable of guaranteeing the reliability. Also, if the impurity concentration in the channel region is made unduly high, the impurity of the high concentration in the channel region is scattered so as to saturate the drain current, with the result that the drain current is not increased even if the channel is shortened. Further, the miniaturization of the device is accompanied by an increase in the resistance of the gate electrode and by generation of parasitic resistance in the source-drain regions.

For overcoming these problems, it has been proposed to decrease the impurity concentration in the channel region formed on a punch-through stopper layer having a high impurity concentration, to use a salicide structure in the source-drain regions, and to use a metal electrode. These measures have been individually put to a practical use.

For example, known is a structure that, after element isolation such as LOCOS, a high impurity concentration layer is formed by ion implantation in the channel region for stopping the punch-through, followed by forming a thin epitaxial silicon layer about 10 nm thick, which is not doped with an impurity, on the channel stopper region so as to form a MOS transistor having a channel region of a low impurity concentration, as disclosed in "IEDM Technical Digest pp.433–436 (1993) (T-Ohguro et al.)" or "IEEE Transactions on Electron Devices, Vol. 45, No. 3 (March 1998), pp. 710–716 (T. Ohguro et al.)".

Figure 1A:
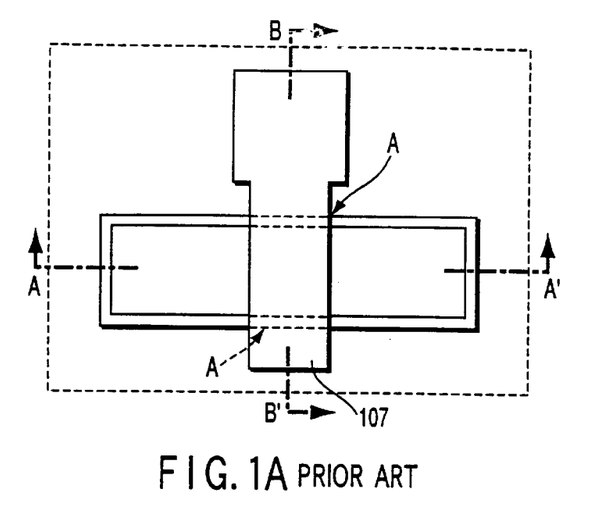
FIGS. 1A to 1C are drawings for collectively illustrating the problems inherent in the conventional semiconductor device.
Figure 1B:
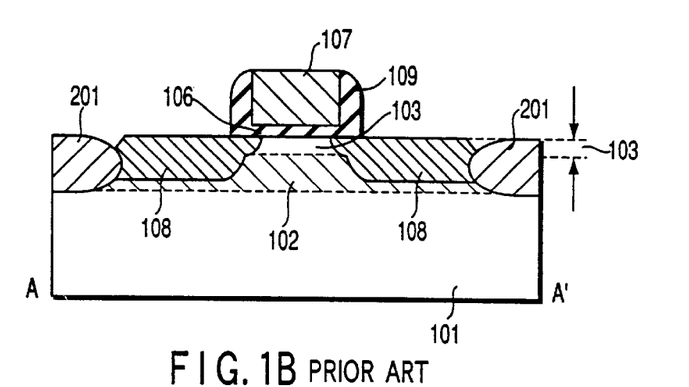
Figure 1C:
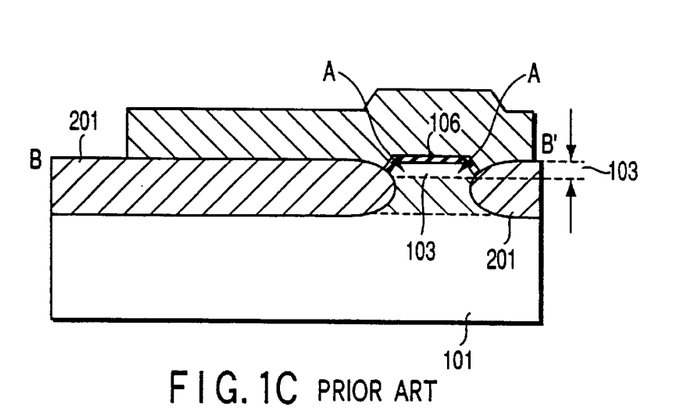

FIGS. 1A, 1B and 1C are an upper view, a cross sectional view in a channel length direction, and a cross sectional view in a channel width direction, respectively, collectively showing the conventional semiconductor device. As shown in FIG. 1B, an element separating insulating film 201 is formed on a silicon substrate 101. A punch-through stopper layer 102 doped with a high concentration of an impurity is formed within the silicon substrate 101. An epitaxial silicon layer 103 is formed on the surface of the silicon substrate 101. A gate electrode 107 is formed on the epitaxial silicon layer 103 with a gate insulating film 106 interposed therebetween. Further, source-drain regions 108 are formed apart from each other in the epitaxial silicon layer 103 and the silicon substrate 101 except the region below the gate electrode 107.

In manufacturing a semiconductor device having the particular transistor structure, the element isolating insulating film 201 is formed first in the silicon substrate 101, followed by forming the epitaxial silicon layer 103 on the substrate 101 at about 600° C. It should be noted that the epitaxial silicon layer 103 is formed after formation of the element isolating insulating film 201. Therefore, it is possible for the epitaxial silicon layer 103 poor in crystallinity to be formed in edge portions of the element isolating region. The epitaxial silicon layer 103 is formed in region A shown in FIG. 1 along the width of the channel. However, the problem of current leakage tends to take place in region A.

Another method is conceivable for avoiding the current leakage problem. Specifically, the punch-through stopper layer 102 having a high impurity concentration is formed first on the silicon substrate 101, followed by forming the epitaxial silicon layer 103 and subsequently forming the element isolating insulating film 201. However, since a heat treatment step under a high temperature is employed in the element isolating step, a problem is generated that impurities are diffused again from the punch-through stopper layer 102 having a high impurity concentration into a region having a low impurity concentration.

To be more specific, formation of the low impurity concentration layer in the channel surface region is made difficult by various high temperature processes including the high temperature process for forming an interfacial oxide film or densifying the buried oxide film in the element isolation step, the high temperature process for forming the gate oxide film and after-oxidation process, the high temperature process for activating the source-drain regions, and the high temperature process for silicidation of the source-drain regions.

As described above, where an element isolation is performed first, followed by forming an epitaxial silicon layer in the conventional semiconductor device, the epitaxial silicon layer poor in crystallinity extends to overlap with the edge portion of the element isolating region, leading to leak current generation. By contraries, where the epitaxial layer is formed first, followed by performing the element separation, formation of a low impurity concentration layer in the channel surface region is made difficult by the high temperature processes for forming the interfacial oxide film for element separation, which is performed after the epitaxial silicon layer formation, for densifying the element isolating insulating film, for forming a thin gate oxide film, and for activating the source-drain regions.

BRIEF SUMMARY OF THE INVENTION

An object of the present invention is to provide a semiconductor device having a transistor structure that makes it possible to suppress the short channel effect accompanying the miniaturization of the transistor and to suppress the current leakage.

Another object of the present invention is to provide a method of manufacturing a semiconductor device having a transistor structure that makes it possible to suppress the short channel effect accompanying the miniaturization of the transistor and to suppress the current leakage.

According to a first aspect of the present invention, there is provided a semiconductor device, comprising a transistor structure including an epitaxial semiconductor layer of a first conductivity type formed on a main surface of a semiconductor substrate of the first conductivity type, a source region of a second conductivity type and a drain region of the second conductivity type formed apart from each other in at least the epitaxial semiconductor layer, a channel region of the first conductivity type formed between the source region and the drain region, and a gate electrode formed on the channel region with a gate insulating film interposed therebetween, an element isolation region being sandwiched between adjacent transistor structures, wherein the channel region in the interface with the gate insulating film has an impurity concentration lower than that of the semiconductor substrate, and the source region and the drain region do not extend to overlap with an edge portion of the element isolating region.

According to a second aspect of the present invention, there is provided a method of manufacturing a semiconductor device, comprising the steps of:

forming a high impurity concentration layer of a first conductivity type in at least a part of a semiconductor substrate of the first conductivity type;

forming a semiconductor layer of the first conductivity type by an epitaxial growth method on a main surface of the semiconductor substrate;

selectively removing the epitaxial semiconductor layer and the semiconductor substrate to form a trench, followed by burying an insulating film for element isolation in the trench; and forming a transistor in a region where the insulating film for element isolation is not formed.

Further, according to a third aspect of the present invention, there is provided a method of manufacturing a semiconductor device, comprising the steps of:

forming a high impurity concentration layer of a first conductivity type in at least a part of a semiconductor substrate of the first conductivity type;

forming a semiconductor layer of the first conductivity type by an epitaxial growth method on a main surface of the semiconductor substrate;

selectively removing the epitaxial semiconductor layer and the semiconductor substrate to form a trench, followed by burying an insulating film for element isolation in the trench;

selectively forming a gate insulating film and a gate electrode on the epitaxial semiconductor layer; and forming a source region of a second conductivity type and a drain region of the second conductivity type with the gate electrode used as a mask, wherein the steps after formation of the high impurity concentration layer are carried out under temperatures not higher than 700° C.

The MOS transistor in the present invention is constructed such that an epitaxial semiconductor layer poor in crystallinity does not extend to overlap with an edge portion of the element isolating region so as to suppress the current leakage. Also, the gate electrode is of a laminate structure consisting of a polycrystalline silicon (polysilicon) film doped with an impurity and a silicide film or a metal film formed on the polysilicon film. The particular construction is effective for decreasing the resistance of the gate electrode. What should also be noted is that the impurity concentration in the channel region in the vicinity of the interface with the gate insulating film is set lower than that in the substrate, making it possible to prevent the drain current from being lowered while suppressing the short channel effect.

Among the total process of forming a MOS transistor, the steps after formation of a layer having a high impurity concentration can be carried out at low temperatures lower than 700° C., making it possible to form a channel region having a low impurity concentration and a layer having a high impurity concentration below the channel region. To be more specific, by suppressing the impurity diffusion from the layer having a high impurity concentration into the channel region in the step of forming the channel region, the impurity concentration in the channel region in the vicinity of the interface with the gate insulating film can be maintained at a level lower than that in the semiconductor substrate. Also, the presence of the layer having a high impurity concentration below the channel region serves to suppress the short channel effect. The impurity diffusion from a layer having a high impurity concentration into the channel region can be prevented by manufacturing a semiconductor device at process temperatures not higher than 700° C., as described in "IEDM Technical Digest pp. 433–436 (1993) (T-Ohguro et al.)" or "IEEE Transactions on Electron Devices, Vol. 45, No. 3 (March 1998), pp. 710–716 (T. Ohguro et al.)".

Further, the element separating insulating film is formed after formation of the channel region by epitaxial growth in the present invention, making it possible to overcome the difficulty inherent in the process in which the element separating insulating film is formed first, i.e., the difficulty that a semiconductor layer poor in crystallinity is formed to extend to overlap with the edge portion of the element separating insulating film.

An additional feature of the present invention is that the depth of each of the source region and the drain region is prevented from being increased by using the low temperature process, making it possible to control the effective channel length $L_{eff}$ and to achieve a transistor structure adapted for suppressing the short channel effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

First Embodiment

Figure 2A:
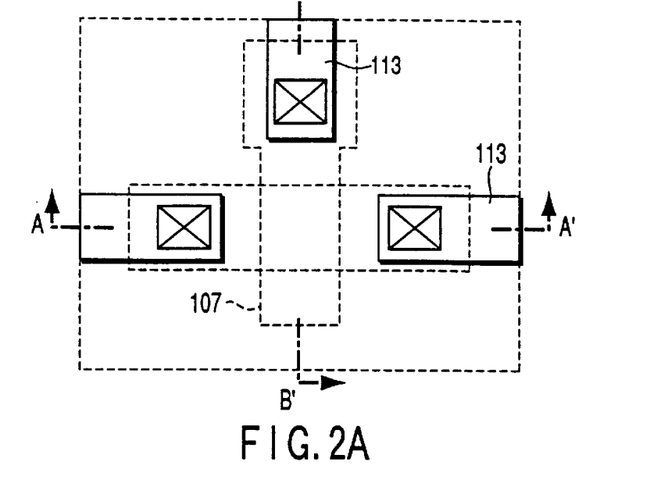
FIGS. 2A to 2C are plan views and cross sectional views showing the entire structure of a semiconductor device according to a first embodiment of the present invention.
Figure 2B:
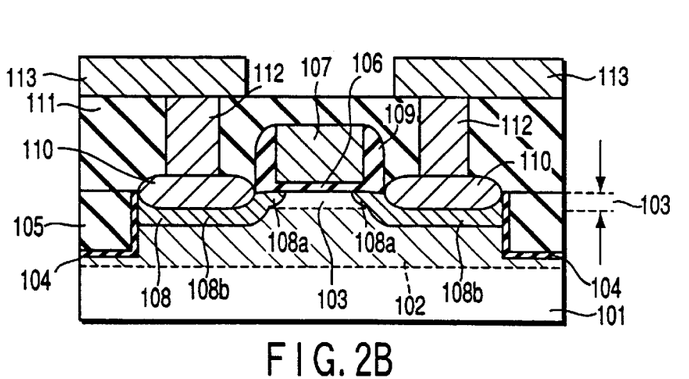
Figure 2C:
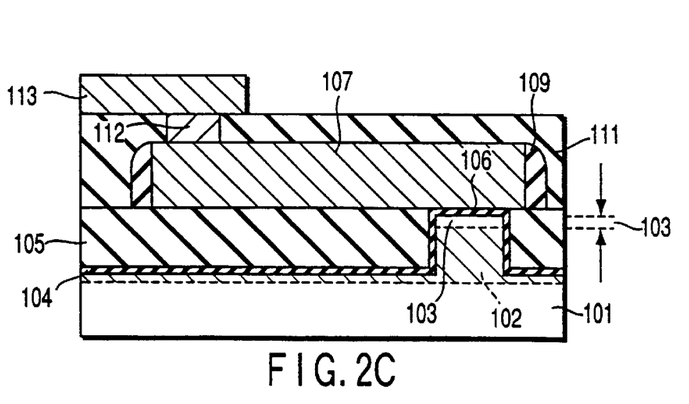

FIGS. 2A to 2C collectively show the entire construction of a semiconductor device (single transistor) according to a first embodiment of the present invention, wherein FIG. 2A is a plan view, FIG. 2B is a cross sectional view along the line A–A' shown in FIG. 1A, which extends in the longitudinal direction of the channel, and FIG. 2C is a cross sectional view along the line B–B' shown in FIG. 1A, which extends in the width direction of the channel. The transistor shown in the drawings is an n-channel transistor.

A p-well (not shown) is formed in a transistor region of a p-type silicon substrate having an impurity concentration of about $5 \times 10^{15}$ cm$^{-3}$. A punch-through stopper layer 102 having about $2 \times 10^{18}$ cm$^{-3}$ of an impurity concentration is formed in a transistor•channel-forming region within the p-well. An epitaxial silicon layer 103 that is not doped with an impurity is formed in a thickness of, for example, about 20 nm on the punch-through stopper layer 102. Also, an STI (Shallow Trench Isolation) element isolating region is formed in that region of the semiconductor substrate 101 in which a transistor is not formed. An oxide film 104 and an insulating film 105 are buried in the element isolating region.

A part of the epitaxial silicon layer 103 functions as a channel region. In order to control the threshold voltage $V_{th}$ of the transistor, a p-type channel impurity layer (not shown) having an impurity concentration of about $5 \times 10^{16}$ cm$^{-3}$ is selectively formed in only the channel region of mainly the epitaxial silicon layer 103. It should be noted that, if the impurity concentration is unduly high, a problem is brought about that the decrease of the channel current is caused by the scattering of the impurity. Therefore, the impurity concentration in the channel region should not exceed $1 \times 10^{17}$ cm$^{-3}$. It should also be noted that, although the impurity concentration in the entire channel region is higher than that in the silicon substrate 101, the impurity concentration in the vicinity of the interface with the gate oxide film 106 is set lower than that in the silicon substrate 101.

A gate electrode 107 consisting of a metal, e.g., a Ti film, a Ru film, a W film, an Al film or a laminate structure of some of these metal films, is formed on a gate insulating film 106. Also, an impurity is diffused with the gate electrode 107 used as a mask so as to form diffusion layers 108a, 108b. These diffusion layers 108a and 108b are formed to have a channel region positioned therebetween. The diffusion layer 108a is an n-type diffusion layer having an impurity concentration of about $5 \times 10^{19}$ cm$^{-3}$ and a diffusion depth of about 0.04 μm. On the other hand, the diffusion layer 108b is an n$^+$-type diffusion layer having an impurity concentration of $5 \times 10^{20}$ cm$^{-3}$ and a diffusion depth of about 0.08 μm. These diffusion layers 108a and 108b are called herein later a source-drain diffusion layer 108.

A silicide film 110, e.g., a TiSi$_2$ film, a CoSi$_2$ film, a PtSi film, a Pd$_2$Si film, an IrSi$_3$ film or a RhSi film, is formed by self-alignment on the surface of the source-drain diffusion layer 108 by using a side wall film 109 formed on the side wall of the gate electrode 107. Further, an interlayer insulating film 111 is formed to cover the insulating film 105, the gate electrode 107, the silicide film 110, etc. Still further, a contact plug 112 connected to the silicide film 110 via the interlayer insulating film 110 and a wiring 113 connected to the contact plug 112 are formed, thereby to form a transistor structure.

Figure 3A:
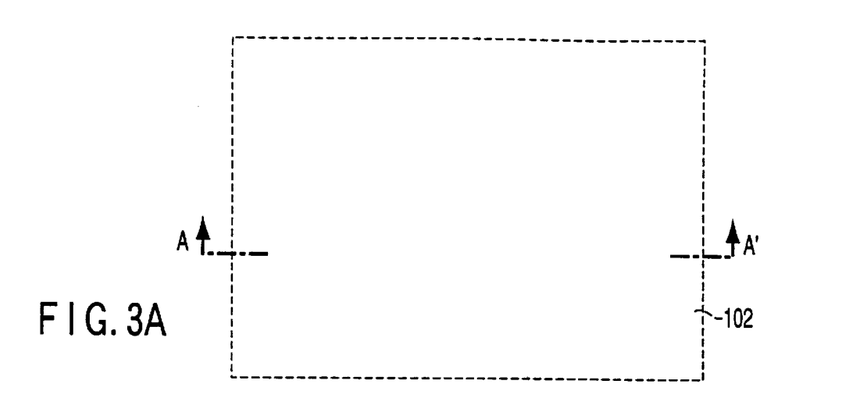
FIGS. 3A and 3B are a plan view and a cross sectional view, respectively, collectively showing the manufacturing process of the semiconductor device according to the first embodiment of the present invention.

The manufacturing process of the transistor of the construction described above will now be described with reference to the cross sectional views shown in FIGS. 3A, 3B, 4A, 4B, 5A, 5B, 6A, 6B, 7A, 7B, 8A, 8B, 9A and 9B. The drawings with a capital letter A put after the numeral, e.g., FIGS. 3A, 4A, etc., are plan views of FIG. 2A. Also, the drawings with a capital letter B put after the numeral, e.g., FIGS. 3B, 4B, etc., are cross sectional views along the line A–A' shown in FIG. 2A.

Figure 3B:
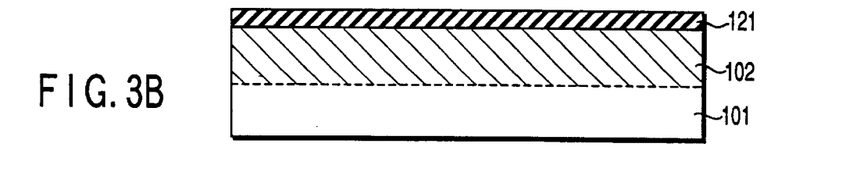
Figure 4A:
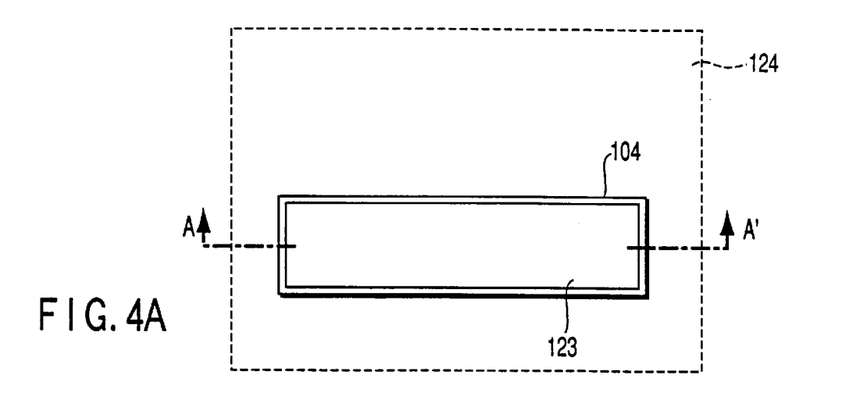
FIGS. 4A and 4B are a plan view and a cross sectional view, respectively, collectively showing the manufacturing process of the semiconductor device according to the first embodiment of the present invention.

In the first step, a p-well (not shown) having a peak impurity concentration of about $4\times10^{17}$ cm$^{-3}$ is formed in a transistor channel region of a (100) p-type silicon substrate 101 by a boron ion implantation under an accelerating energy of 260 KeV and at a dose of $2\times10^{13}$ cm$^{-2}$, as shown in FIG. 3B. The silicon substrate has an impurity concentration of about $5\times10^{15}$ cm$^{-3}$ Then, a high concentration of an impurity is introduced into the transistor and the channel-forming region within the p-well to form a punch-through stopper layer 102. The punch-through stopper layer 102 is formed by, for example, a boron ion implantation to have an impurity distribution of about $2\times10^{18}$ cm$^{-3}$ as a peak concentration by using a resist film (not shown) as a mask. After the ion implantation step, the ion implanted layer is activated. Before the activation step, an oxide film 121 such as a SiO$_2$ film is formed in a thickness of about 8 nm on the surface of the silicon substrate 101 so as to prevent the silicon substrate 101 from being contaminated with the resist material in the activation step. The ion implanted layer is activated by an RTA (Rapid Thermal Anneal) for 5 minutes at about 900° C. under an N$_2$ atmosphere. A p-type impurity layer having a sharp profile can be formed by this activating treatment.

Figure 4B:
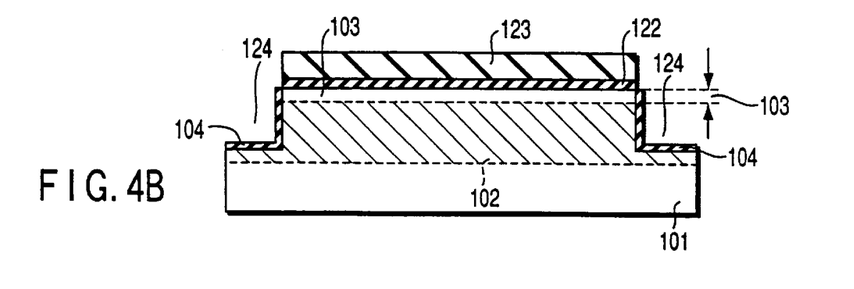

In the next step, the oxide film 121 is removed. A native oxide film is also removed to expose the surface of the silicon substrate 101 to the outside, as shown in FIG. 4B. The native oxide film can be removed by, for example, a heat treatment at about 700° C. using hydrogen radicals (H*). The heat treatment is carried out within a furnace of an epitaxial film growing apparatus.

An epitaxial silicon layer 103 is grown on the entire surface of the exposed silicon substrate 101. The epitaxial silicon layer 103 is formed at, for example, about 700° C. in a thickness of about 20 nm.

In the step of the growing the epitaxial silicon layer and in the subsequent heat treating steps, impurities are diffused again from the punch-through stopper layer 102 formed previously on the surface of the silicon substrate 101 into the epitaxial silicon layer 103. Therefore, the step for forming the epitaxial silicon layer 103 and the subsequent heat treating steps should be performed at temperatures as low as possible. To be more specific, it is desirable to carry out all the heat treating steps by a low temperature process not higher than 700° C. By employing the low temperature process that is to be described below, the re-diffusion of impurities from the punch-through stopper layer 102 into the silicon epitaxial layer 103 can be markedly suppressed.

Figure 5A:
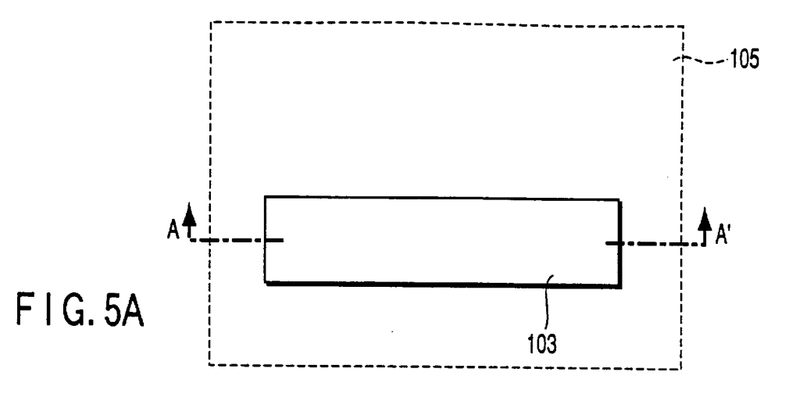
FIGS. 5A and 5B are a plan view and a cross sectional view, respectively, collectively showing the manufacturing process of the semiconductor device according to the first embodiment of the present invention.
Figure 5B:
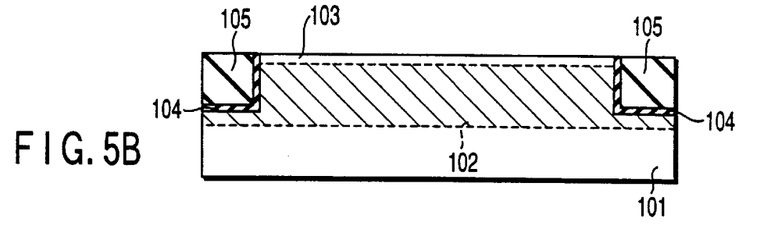

Then, a trench 124 having a depth of about 0.2 μm is formed in the epitaxial silicon layer 103 and the silicon substrate 101 by employing, for example, a reactive ion etching (RIE) method. Before forming the trench 124, a laminate structure consisting of a buffer oxide film 122 having a thickness of about 8 nm and a silicon nitride (Si$_3$N$_4$) film 123 having a thickness of, for example, 100 nm is formed on the epitaxial silicon layer 103 as an etching mask.

An oxygen radical oxidizing method that permits forming a high quality oxide film at a low temperature, i.e., about 700° C., is employed for forming the buffer oxide film 122. In the oxygen radical oxidizing method, an oxidizing source gas containing oxygen atom radicals as a main component in an excited state is supplied onto the silicon substrate 101 so as to oxidize the surface of the silicon substrate 101, thereby to form a silicon oxide film of a high performance at a low temperature (about 700° C.).

In the next step, the silicon nitride film 123, the buffer oxide film 122, the epitaxial silicon layer 103 and the silicon substrate 101 are processed by using a resist film (not shown). Then, the etching damage, etc. imparted to the inner surface of the trench 124 in the step of forming the trench 124 is cleaned and removed by, for example, an ashing treatment, a wet treatment, etc. The surface of the silicon substrate 101 within the trench 124 is exposed, followed by forming an oxide film 104 having a thickness of about 7 nm on the side surface and bottom surface of the trench 124 by employing a radical oxidizing method that permits forming a high quality oxide film at a low temperature.

In the next step, an insulating film 105 such as a TEOS oxide film is buried in the trench 124 with the oxide film 104 interposed therebetween so as to form a so-called "trench type" element isolation layer (STI: Shallow Trench Isolation), as shown in FIG. 5B. To be more specific, a TEOS oxide film is deposited at 650° C. on the entire surface in a thickness of about 300 nm by a CVD method, followed by densifying the CVD oxide film under a radical oxidizing atmosphere set at about, for example, 700° C. Further, the entire surface is flattened by a CMP (Chemical Mechanical Polishing) method. In this step, the insulating film 105 is buried in the trench 124 by utilizing the difference in the CMP etching rate between the silicon nitride film 123 and the CVD oxide film.

Further, the silicon nitride film 123 is removed by a wet etching with, for example, a hot phosphoric acid, followed by peeling the buffer oxide film 122 with a hydrofluoric acid-based solution so as to expose the surface of the epitaxial silicon layer 103.

Figure 6A:
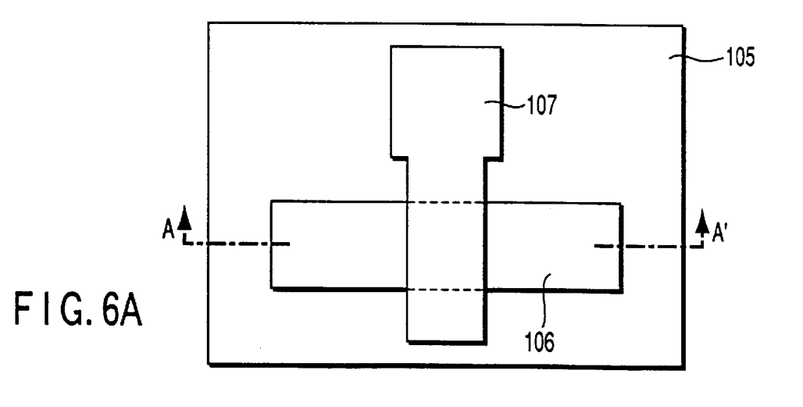
FIGS. 6A and 6B are a plan view and a cross sectional view, respectively, collectively showing the manufacturing process of the semiconductor device according to the first embodiment of the present invention.
Figure 6B:
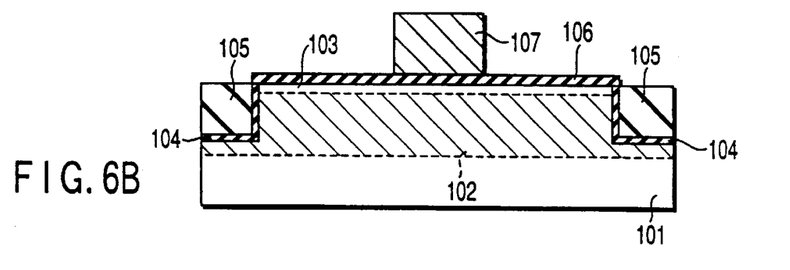

In the next step, a gate insulating film (oxide film) 106 is formed in a thickness of about, for example, 5 nm on the exposed surface of the epitaxial silicon layer 103 by employing a radical oxidizing method, as shown in FIG. 6B. By the formation of the gate insulating film 106 by radical oxidation, an oxide film is formed on the silicon layer 103 low in irregularity. It follows that a MOS transistor channel low in the channel mobility, which is caused by the channel interface scattering and the impurity scattering, can be achieved by combination of the radical oxidation and the reduction in the impurity concentration in the channel region (i-type layer channeling) described herein later.

It should be noted that, in the radical oxidation, the oxide film is formed in a predetermined thickness under a certain temperature. Therefore, an unevenness in the thickness of the oxide film can be diminished over the entire wafer and among different chips.

A tantalum oxide (Ta$_2$O$_5$) film can be used in place of the gate insulating film 106 consisting of SiO$_2$. The Ta$_2$O$_5$ film has a relative dielectric constant $\in_r$ relatively larger than that, which is 3.9, of a SiO$_2$ film. To be more specific, the relative dielectric constant $\in_r$ for the tantalum oxide film is about 20 to 27. As a result, it is possible for the tantalum oxide film to have an oxide film equivalent film thickness not larger than 2 nm.

Where the tantalum oxide film is used as the gate insulating film 106, it is possible to use a laminated gate insulating film structure in order to decrease the interfacial level density at the interface with the epitaxial silicon layer 103. For example, a SiO$_2$-based film having a thickness of about 1 nm is formed first on the interface with the epitaxial silicon layer 103, followed by forming a Ta$_2$O$_5$ film on the SiO$_2$-based film to form the laminate structure. A low temperature process performed at a temperature not higher than 700° C. is employed for forming the gate insulating film 106.

A channel ion implantation is applied, if necessary, to only the channel region including the epitaxial silicon layer 103 by using a resist film (not shown) as a mask. In the case of an n-channel transistor, impurity ions, e.g., $B^+$, are implanted under an accelerating energy of 10 KeV at a dose of about $5 \times 10^{12}$ cm$^{-2}$ in order to set the threshold voltage $V_{th}$ at about 0.7V. By this ion implantation, a p-type channel impurity layer (not shown) is selectively formed in only the channel region. In this step, the ion implantation is performed through a buffer oxide film (not shown) such as a SiO$_2$ film. However, it is also possible to peel the buffer oxide film, followed by forming a SiO$_2$ film (not shown) as a sacrificial oxide film. In this case, the ion implantation is performed through the sacrificial oxide film.

It is possible to employ another heat treatment for activating the channel impurity layer formed by the additional ion implantation described above. For example, it is possible to activate the channel impurity layer by performing an RTA at 700° C. for about 10 seconds. Incidentally, it is possible to perform the RTA at a temperature not lower than 700° C. for shortening the RTA time. In the case of performing the RTA at a temperature not lower than 700° C., it is necessary to perform the RTA under the conditions that prevent the impurity profile of the channel from being disturbed.

Since it is necessary to perform the heat treatment after formation of the additional channel impurity layer at a low temperature (not higher than 700° C.), a so-called "cryogenic ion implantation method", which is performed by controlling the temperature of the semiconductor device under the ion implantation at a low level, is employed for the ion implantation into the channel layer. The particular ion implantation method makes it possible to perform the activation at a low temperature while suppressing the damage done to the crystals during the ion implantation step. Incidentally, the channel impurity layer can also be activated at a low temperature, e.g., about 700° C., by using an excimer laser.

For performing the cryogenic ion implantation, the silicon substrate temperature is set at about −150° C., and impurity ions are implanted within a reaction chamber held under vacuum within a vacuum chamber under an ion implanting energy of 10 KeV and a beam current of 10 mA. It follows that the power during the ion implanting step is about 10W. Incidentally, it suffices to set the power in the ion implanting step at a level not higher than 10W. The power in the ion implanting step is held at a low level not higher than 10W in order to suppress the heat generation from the substrate during the ion implantation. Incidentally, the ion implantation step can be divided such that the ion implanting operations are performed several times in order to suppress the beam current for each ion implanting operation at a low level. In this case, the sum of the power for all the ion implanting operations should be set at a level not higher than 10W. The substrate temperature during the cryogenic ion implantation can be set at an optional level as far as the temperature is not higher than −135° C., though the substrate temperature of about −150° C. is referred to above.

Then, a polycrystalline silicon (polysilicon) film doped with, for example, an n-type impurity is deposited on the entire surface in a thickness of about 200 nm, followed by patterning the deposited polysilicon film using a resist film (not shown) as a mask so as to form a gate electrode 107. In the case of using a Ta$_2$O$_5$ film as the gate insulating film 106, it is desirable to use a TiN film, a W/TiN laminate film or an Al/TiN laminate film as the gate electrode 107.

Figure 7A:
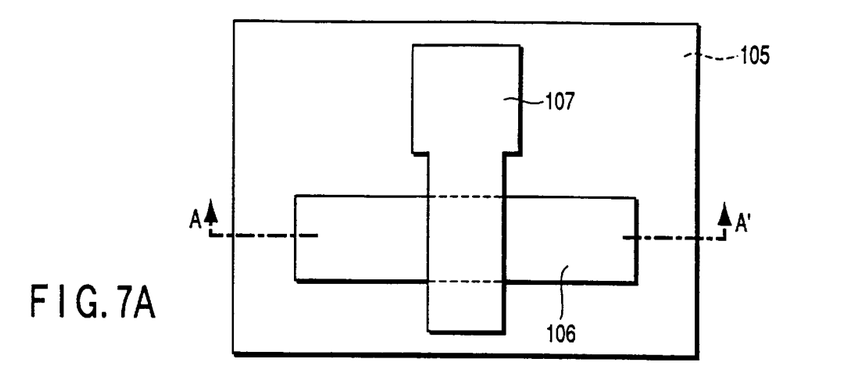
FIGS. 7A and 7B are a plan view and a cross sectional view, respectively, collectively showing the manufacturing process of the semiconductor device according to the first embodiment of the present invention.
Figure 7B:
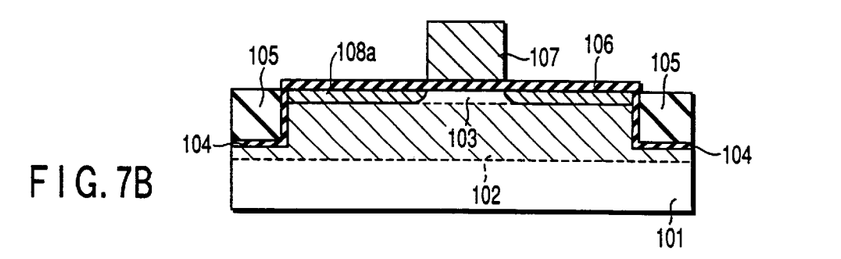

In the next step, an n$^-$-type source-drain diffusion layers 108a are formed by, for example, a cryogenic ion implantation method, which is unlikely to impart an ion implantation damage to the epitaxial silicon layer 103, using the gate electrode 107 as a mask, as shown in FIG. 7B. In this step, it is possible to employ, for example, a radical oxidizing method or an RTO (Rapid Thermal Oxidation) method for moderating the current concentration on the side wall or the corner portions in the bottom of the gate electrode 107. In the case of using these methods, an oxide film (not shown) having a thickness of about 5 nm is formed on the side wall or the corner portions in the bottom of the gate electrode 107.

For forming the shallow source-drain diffusion layers 108a, it is possible to employ a solid phase diffusion method in place of the ion implantation method. The source-drain diffusion layers 108a can be formed by implanting, for example, phosphorus ions (P$^+$) under an ion accelerating energy of 40 KeV and at a dose of $4 \times 10^{13}$ cm$^{-2}$. Of course, arsenic (As) ions or the like can be implanted in place of the phosphorus ions for forming the source-drain diffusion layers 108a.

Figure 8A:
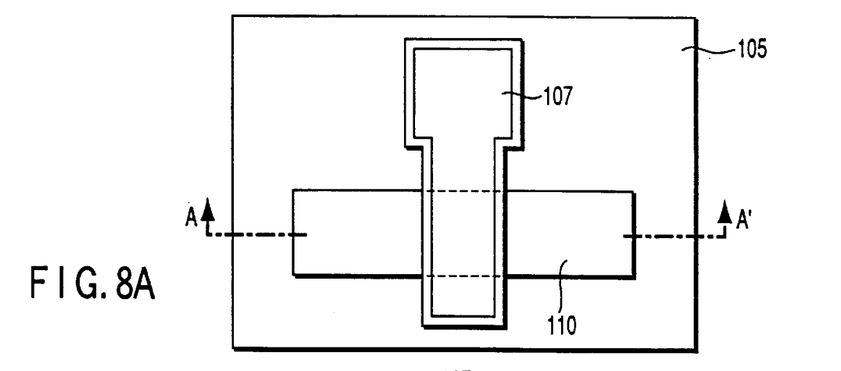
FIGS. 8A and 8B are a plan view and a cross sectional view, respectively, collectively showing the manufacturing process of the semiconductor device according to the first embodiment of the present invention.
Figure 8B:
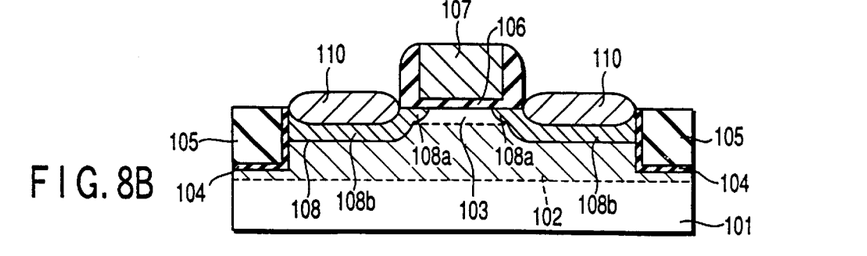

In the next step, a SiO$_2$ film is deposited on the entire surface by a CVD method, followed by applying a RIE treatment to the entire surface so as to allow a side wall film 109 consisting of SiO$_2$ to remain on the side wall portions of the gate electrode 107, as shown in FIG. 8B. The side wall film 109 thus formed has a thickness of about 20 nm. Incidentally, it is possible for the side wall film 109 to consist of silicon nitride in place of silicon dioxide.

After formation of the side wall film 109, n$^+$-type source-drain diffusion layers 108b are formed by an ion implantation method using, for example, arsenic (As) ions under an ion accelerating energy of 15 KeV and at a dose of $5 \times 10^{15}$ cm$^{-2}$. These diffusion layers 108b and the diffusion layers 108a are combined to form the source-drain diffusion layers 108 having a so-called "gate extension structure".

In place of the gate extension structure noted above, it is possible to employ a so-called "single source-drain structure" consisting of an n$^-$-type diffusion layer alone or an n$^+$-type diffusion layer alone. The ion implanting conditions and the activating conditions are controlled to achieve a desired depth of the diffusion layers 108. To be more specific, the n$^-$-type diffusion layers 108a and n$^+$-type diffusion layers 108b are controlled to have a junction depth $X_j$ of about 0.05 μm and about 0.06 μm, respectively, by performing the final thermal activation treatment at a low temperature not higher than 700° C.

It is desirable to perform a heat treatment using an excimer laser for the activation at a low temperature. Alternatively, it is possible to perform the activation by a high speed heat treatment at about 850° C. under less than a millisecond. It is also possible to employ the heat treatment using an excimer laser and the high speed heat treatment under less than a millisecond in combination. In this case, it is necessary to suppress finally the junction depth $X_j$ of the diffusion layer 108a to about 0.05 μm by the thermal activation, though the treating temperature exceeds 700° C. In this fashion, the source-drain diffusion layer 108 can be made high in impurity concentration and can also be made shallow by performing an ion implantation and activation at a low temperature.

Then, a silicide film 110 such as a TiSi$_2$ film, a CoSi$_2$ film, a PtSi film, a Pd$_2$Si film, an IrSi$_3$ film or a RhSi film is formed on each of the exposed surfaces of the source-drain diffusion layers 108 at a low temperature lower than 700° C. in a time not longer than 30 minutes. In case of employing an RTA, the operation for forming the silicide layer 110 is performed at, for example, 700° C. for about 10 seconds. The silicide films 110 are self-aligned with at least the source-drain diffusion layers 108. As a result, the resistivity of the source-drain diffusion layer 108 can be lowered to a low level lower than, for example, 50 $\mu\Omega$·cm. Particularly, in the case of a p-channel transistor, a $Pd_2Si$ film is effective for lowering the contact resistance with the $p^+$-type diffusion layer.

As described above, the contact resistance of the $p^+$-type diffusion layer can be decreased by introducing a new silicide material such as $Pd_2Si$ that can form a silicide film at a low temperature. It follows that it is possible to provide a MOS transistor in which the source-drain diffusion layers 108 have a small parasitic resistance.

Figure 9A:
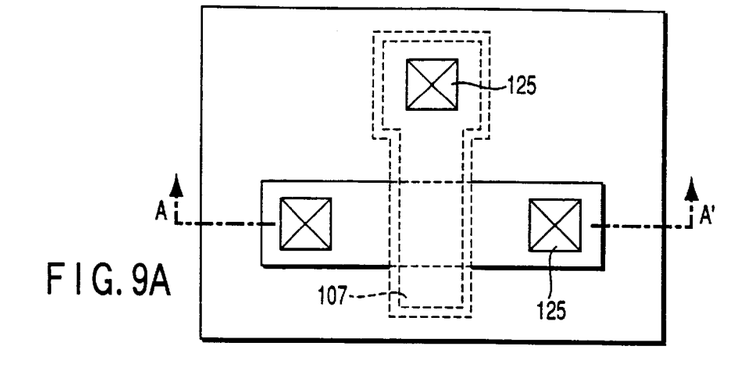
FIGS. 9A and 9B are a plan view and a cross sectional view, respectively, collectively showing the manufacturing process of the semiconductor device according to the first embodiment of the present invention.
Figure 9B:
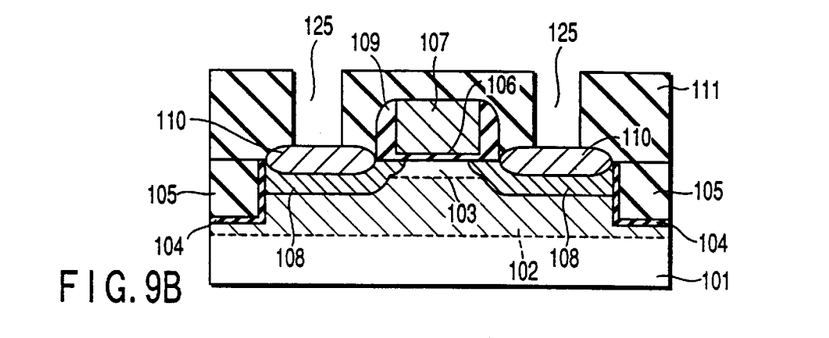

In the next step, an interlayer insulating film 111 consisting of $SiO_2$ is formed by CVD on the entire surface in a thickness of about 300 nm, as shown in FIG. 9B. Then, the interlayer insulating film 111 is densified for about 3 minutes under a radical oxidizing atmosphere of about 700° C. It is possible to activate the impurity ions implanted into the source-drain diffusion layer 108 in this heat treating step. Where the densifying heat treatment is also intended to activate the diffusion layer 108 and it is intended to suppress the depth $X_j$ of the source-drain diffusion layer 108, it is desirable to perform the densifying heat treatment at a low temperature, e.g., about 700° C. Alternatively, it is possible to carry out an annealing treatment for a short time, i.e., on the order of milliseconds, at about 850° C. by employing an RTA method. Further, it is possible to employ these two treatments in combination so as to activate the ion-implanted layers. After the activating treatment, the interlayer insulating film 111 on the entire surface is flattened by a CMP method.

After the flattening step, contact holes 125 are formed to expose the silicide film 110 by a RIE method using a resist film (not shown), followed by forming a contact plug 112 in the contact hole 125 and subsequently forming a wiring 113 made of aluminum, as shown in FIGS. 2A and 2B. Finally, a passivation film (not shown) is deposited on the entire surface so as to form the basic construction of the transistor shown in FIGS. 2A to 2C. Incidentally, the contact plug 112 consists of a tungsten (w) film, an aluminum (Al) film, or a laminate structure of titanium nitride (TiN) film/titanium (Ti) film.

Figure 10:
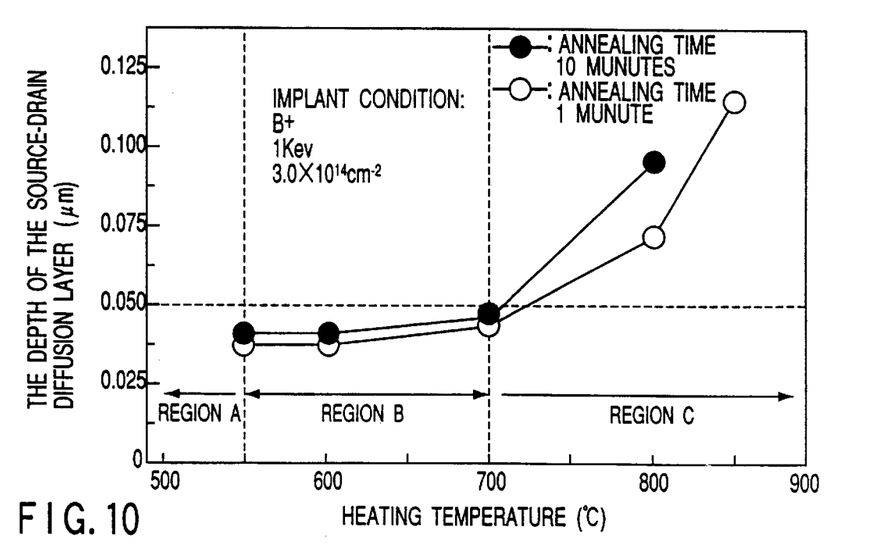
FIG. 10 is a graph showing the relationship between the diffusion depth of source-drain regions and the RTA temperature in the semiconductor device according to the first embodiment of the present invention.

As described above, the heat treatments after formation of the punch-through stopper layer 102, which contains a high concentration of an impurity, are carried out at low temperatures not higher than 700° C. in the present invention. The reasons for carrying out the heat treatments at low temperatures will now be described with reference to a graph shown in FIG. 10. Specifically, FIG. 10 is a graph showing the relationship between the depth of the source-drain diffusion layer and the RTA temperature after formation of the diffusion layer. In the graph of FIG. 10, the heating temperature is plotted on the abscissa, with the depth of the diffusion layer plotted on the ordinate. The graph covers the case where boron ions ($B^+$) were implanted under an accelerating energy of 1 KeV and at a dose of $3.0 \times 10^{14}$ $cm^{-2}$.

As shown in FIG. 10, the source-drain diffusion layers can be formed shallow where the heating temperature is not higher than 700° C. in each of the cases where the annealing time is 1 minute and where the annealing time is 10 minutes. In this case, the depth of the source-drain diffusion layer is not larger than only 0.05 $\mu$m. However, where the heat treatment is performed at temperatures higher than 700° C., the source-drain diffusion layer is expanded in the heating step so as to increase the depth of the diffusion layer. As a result, it is impossible to suppress the short channel effect. On the other hand, where the heat treatment is performed at temperatures not higher than 700° C., the expansion of the diffusion layer can be suppressed so as to suppress the short channel effect, as apparent from the graph of FIG. 10.

It should also be noted that, in the case of employing the heat treatment performed at temperatures not higher than 700° C. in the manufacture of a semiconductor device, it is possible to suppress the impurity diffusion from the punch-through stopper layer 102 into the channel region, which is also described in "IEDM Technical Digest pp. 433–436 (1993) (T-Ohguro et al.)" and "IEEE Transactions on Electron Devices, Vol. 45, No. 3 (March 1998), pp. 710–716 (T. Ohguro et al.)".

As described above, the heat treatments after formation of the punch-through stopper layer 102 are carried out in the present invention at low temperatures. To be more specific, a radical oxidation method is employed in the present invention for oxidizing silicon side wall of STI or for densifying the CVD oxide film 104, making it possible to form the oxide film at a low temperature. Also, the sacrificing oxide film and the gate oxide film are formed by an oxidizing method that is carried out at a low temperature so as to manufacture a transistor. As a result, it is possible to suppress the impurity diffusion from the punch-through stopper layer 102 formed in the silicon substrate 101 and containing a high concentration of an impurity into epitaxial silicon layer 103. It follows that a low impurity concentration can be achieved in the channel region in the vicinity of the interface with the gate insulating film. The particular construction makes it possible to prevent the drain current from being decreased while suppressing the short channel effect. To reiterate, a high quality oxide film can be formed at a low temperature in the present invention by utilizing a radical oxidizing method. Also, a cryogenic ion implantation method is employed in the present invention for implanting impurity ions, making it possible to activate the implanted ions at a low temperature. These techniques are combined to produce the prominent effect of the present invention described above.

It should also be noted that, since the process for forming a transistor can be performed at a low temperature, a film having a high dielectric constant can be easily used for forming the gate insulating film 106. As a result, the gate insulating film 106 can be made further thinner.

Also, since the heat treatment can be performed at a low temperature, it is possible to prevent the depth of the source-drain diffusion layers 108 from being increased so as to provide a transistor structure capable of suppressing the short channel effect.

Also, the silicide film 110 that can be formed at a low temperature is formed on the source-drain diffusion layers 108 in the present invention so as to decrease the contact resistance and, thus, to form a MOS transistor in which the source-drain diffusion layers 108 have a low parasitic resistance.

Further, since a radical oxidizing method is employed in the present invention for forming the gate insulating film 106, the maximum electric field $E_{max}$ for the gate insulating film 106 at which the reliability of the gate insulating film 106 can be guaranteed for 10 years is higher than that for the ordinary oxide film. As a result, the gate insulating film 106 can be made further thinner than the ordinary thermal oxide film. It should also be noted that, in the case of employing a radical oxidizing method, the thickness of the formed oxide film is maintained constant under a certain temperature so as to diminish the nonuniformity in the thickness of the oxide film over the entire wafer and among different chips. Since it is possible to form an oxide film low in irregularity on the surface, a MOS transistor low in reduction of the channel mobility caused by the channel interface scattering and the impurity diffusion can be achieved in combination with the low impurity concentration in the channel region in the vicinity of the interface with the gate insulating film.

What should also be noted is that, in the present invention, STI (Shallow Trench Isolation) is performed after formation of the epitaxial silicon layer 103. Naturally, the epitaxial silicon layer 103 does not extend to overlap with the edge portion of the STI layer so as to suppress an increase in the current leakage in the STI edge portion in the direction of the channel width. Further, the process of manufacturing a conventional planar transistor can be employed in the present invention, making it possible to improve the transistor performance without making complex the manufacturing process and the construction of the transistor.

Second Embodiment

Figure 11:
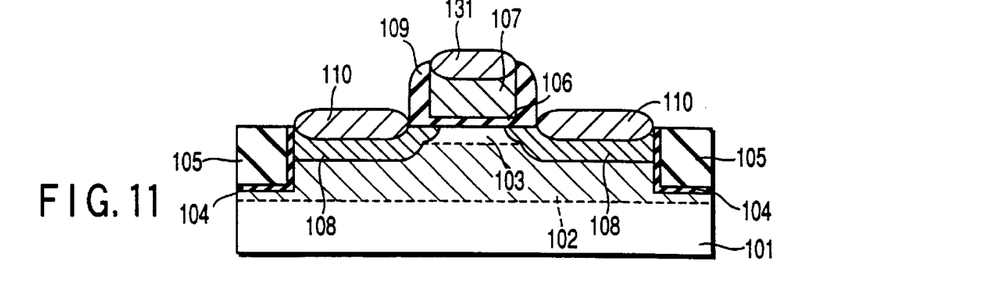
FIG. 11 is a cross sectional view showing the entire construction of a semiconductor device according to a second embodiment of the present invention.

FIG. 11 is a cross sectional view showing the entire structure during manufacture of a semiconductor device according to a second embodiment of the present invention. The manufacturing process of the semiconductor device according to the second embodiment is substantially equal to that of the semiconductor device of the first embodiment described above. Therefore, detailed description of the manufacturing process will be omitted concerning the second embodiment. Incidentally, FIG. 11 corresponds to FIG. 8B relating to the first embodiment.

In the first embodiment, a polysilicon film doped with an n-type or p-type impurity is used as the gate electrode 107. In the second embodiment shown in FIG. 11, however, a silicide film 131 is formed selectively on the surface of the gate electrode 107 so as to form a gate electrode structure, thereby to decrease the wiring resistance of the gate electrode 107. The second embodiment overlaps with the first embodiment in the other respects and, thus, the same reference numerals are put to the same members of the semiconductor device so as to omit the detailed description thereof.

The silicide film 131 can be formed simultaneously with formation of the silicide film 110 formed on the source-drain diffusion layers 108. To be more specific, it suffices to expose the surface of the polysilicon layer forming the gate electrode 107 in the step of exposing the surfaces of the source-drain diffusion layers. The material of the silicide film 131 is selected from the films of $TiSi_2$, $CoSi_2$, PtSi, $Pd_2Si$, $IrSi_3$, RhSi, etc. as already described in conjunction with the first embodiment. Also, the silicide film 131 is formed at a low temperature not higher than 700° C. The other steps are equal to those described previously in conjunction with the first embodiment.

The wiring resistance of the gate electrode structure can be decreased by selectively forming the silicide film 131 on the surface of the gate electrode 107 so as to form a gate electrode structure.

Third Embodiment

Figure 12A:
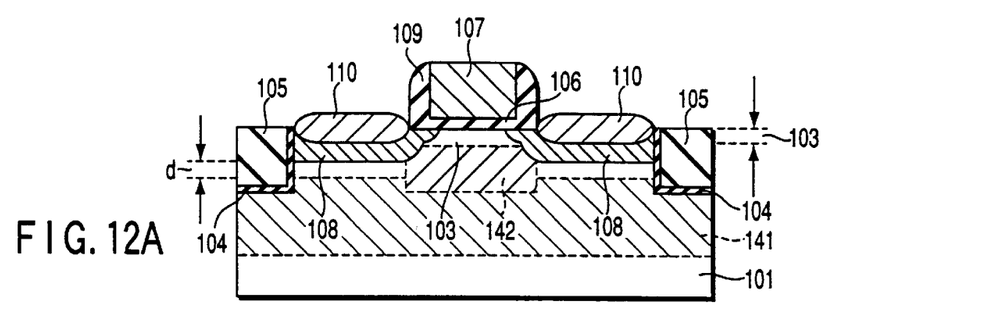
FIGS. 12A and 12B are cross sectional views collectively showing the entire construction of a semiconductor device according to a third embodiment of the present invention.
Figure 12B:
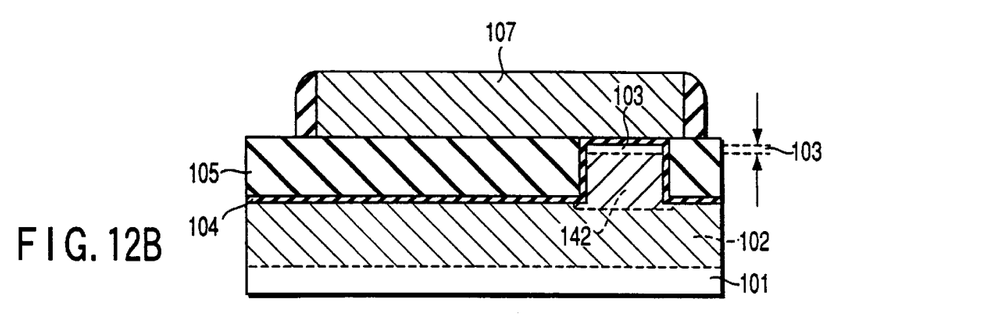

FIGS. 12A and 12B collectively show the entire structure during manufacture of a semiconductor device according to a third embodiment of the present invention. The manufacturing process of the semiconductor device for this embodiment is substantially equal to that for the first embodiment and, thus, the detailed description of the manufacturing process will be omitted. It should be noted that FIG. 12A corresponds to FIG. 8 relating to the first embodiment, and FIG. 12B is a cross sectional view in the direction of the channel width, i.e., a cross sectional view along the line B–B' shown in FIG. 2A.

In the third embodiment, a distance d is provided between the bottom surface of the source-drain diffusion layer and the punch-through stopper layer. The distance d is about, for example, 0.01 μm. The particular construction can be achieved by, for example, forming a position $R_p$ of the peak impurity concentration of the first punch-through stopper layer 141, which corresponds to the punch-through stopper layer 102 in the first embodiment, in the silicon substrate 101 in a position about 0.01 μm lower than that in the first embodiment. Where the capability of suppressing the short channel effect is lowered by setting the position $R_p$ of the peak impurity concentration of the first punch-through stopper layer 141 at a position lower than that in the pouch-through stopper layer 102 of the first embodiment, it is desirable to form selectively the second punch-through stopper layer 142 in the channel region right under the gate electrode 107, as shown in FIG. 12. Where the short channel effect is sufficiently suppressed, the punch-through stopper layer 142 need not be formed.

The manufacturing process of the semiconductor device of the third embodiment is common with that of the first embodiment, except that, in the third embodiment, the second punch-through stopper layer 142 is formed immediately before or after formation of the first punch-through stopper layer 141. The second punch-through stopper layer 142 is formed by selectively implanting impurity ions into a desired region with a resist mask (not shown) put on the surface of the silicon substrate 101. Alternatively, the second punch-through stopper layer 142 can be formed by implanting impurity ions into an epitaxial silicon layer formed first.

In any case, it suffices to form the punch-through stopper layer 142 having a high impurity concentration right under the channel region such that the surface of the epitaxial silicon layer 103 of the channel region has a low impurity concentration not higher than $5 \times 10^{16}$ $cm^{-3}$ so as to suppress the short channel effect.

The construction of and reason for providing a distance d between the bottom surface of the source-drain diffusion layer 108 and the punch-through stopper layer 141 will now be described.

In the first embodiment, the channel region of the transistor is formed of the epitaxial silicon layer 103, and the first embodiment is designed such that the impurity is slightly diffused again from the punch-through stopper layer 102 having a high impurity concentration and formed in the silicon substrate 101 into the epitaxial silicon layer 103 during the subsequent heat treatment.

However, the punch-through stopper layer 102 having a high impurity concentration and formed in the silicon substrate 191 was in contact with the source-drain diffusion layer 108, which has a high impurity concentration, at the bottom surface of the source-drain diffusion layer 108. In this construction, a pn junction of a higher impurity concentration is expected to be formed between the diffusion layer 108 and the stopper layer 102. If a pn junction of a high impurity concentration is formed, it is conceivable that the junction leak current may be increased because of the high impurity concentration in each of the diffusion layer 108 and the stopper layer 102 so as to make the semiconductor device inoperable.

Figure 13:
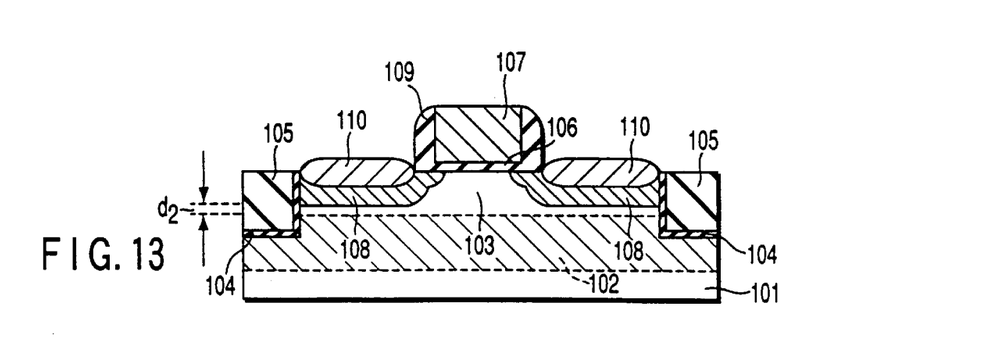
FIG. 13 is a cross sectional view showing the entire construction of a semiconductor device according to a modification of the third embodiment of the present invention.

In order to overcome this difficulty, the distance d is provided between the source-drain diffusion layer 108 and the first punch-through stopper layer 141. As a result, the impurity of the high concentration is unlikely to be diffused again. It is also possible to prevent formation of a pn junction and suppress the junction leak current. Also, since the second punch-through stopper layer 142 is formed in a lower portion of the channel region having a low impurity concentration below the gate electrode 107, it is possible to suppress the short channel effect.

Where the short channel effect can be suppressed without forming the second punch-through stopper layer 142, it is possible to omit formation of the second punch-through stopper layer 142. FIG. 13A is a cross sectional view along the line A–A' in this case. It is possible to set a distance $d_2$ between the source-drain diffusion layer 108 and the first punch-through stopper layer 141 at about 0.01 to 0.005 μm.

In this embodiment, the area of the pn junction having a high impurity concentration between the source-drain diffusion layer 108 and the first punch-through stopper layer 141 can be diminished so as to lower the source-drain junction leak current.

Fourth Embodiment

Figure 14:
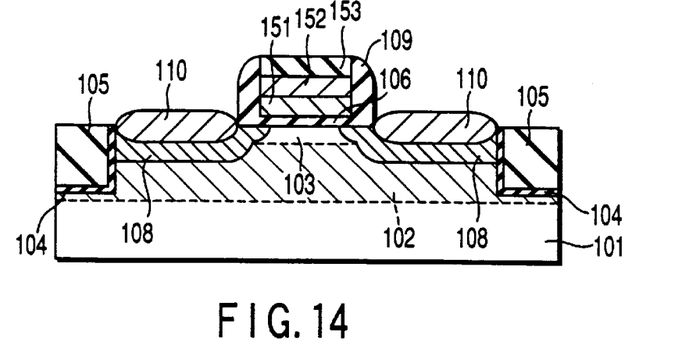
FIG. 14 is a cross sectional view showing the entire construction of a semiconductor device according to a fourth embodiment of the present invention.

FIG. 14 shows the entire structure during manufacture of a semiconductor device according to a fourth embodiment of the present invention. The manufacturing process of the semiconductor device of the fourth embodiment is substantially equal to that of semiconductor device of the first embodiment and, thus, the detailed description of the manufacturing process is omitted concerning the fourth embodiment. Incidentally, FIG. 14 corresponds to the cross sectional view along the line A–A' shown in FIG. 8B.

In the first embodiment, an ordinary polysilicon is used for forming the gate electrode 107. In the second embodiment, the silicide film 131 is formed on the polysilicon gate electrode 107 so as to lower the wiring resistance of the gate electrode 107. In the fourth embodiment, the construction of the gate electrode is changed so as to lower the wiring resistance of the gate electrode 107.

As shown in FIG. 14, a silicide film 152 is formed in a thickness of, for example, 75 nm on a polysilicon layer 151 doped with an n-type or p-type impurity and having a thickness of, for example, about 75 nm. Further, a SiN film 153 is formed in a thickness of, for example, 20 nm on the silicide film 152.

In the next step, the SiN film 153 is patterned by a RIE method using a resist film (not shown) as a mask, followed by patterning the silicide film 152 and the polysilicon film 151 positioned below the SiN film 153 by using the patterned SiN film as a mask so as to form a laminated gate electrode structure.

The kind of the silicide film 152 may be the same as or different from the silicide film 110 formed on the source-drain diffusion layer 108. It is desirable to use, for example, $TiSi_2$ or $WSi_2$ for forming the silicide film. It is also possible to use a metal film in place of the silicide film 152. In this case, the film 152 may be of, for example, a laminate structure of W (tungsten) film/WN (tungsten nitride) film formed in a thickness of about 3 nm to introduce the tungsten film or the tungsten nitride film to the interface with the polysilicon layer 151.

Further, it is possible to omit the polysilicon layer 151 at the interface with the gate insulating film 106 such that a metal film such as an Al/TiN laminate structure, a W/TiN laminate structure, or a Ru/TiN laminate structure is formed in direct contact with the gate insulating film 106. Since the oxide film formed by a radical oxidation is a high quality film having a high density, the metal material is not diffused into the gate insulating film 106 even if the metal film is formed in direct contact with the gate insulating film 106. Naturally, the particular construction is effective for suppressing the wiring resistance of the gate electrode.

Fifth Embodiment

Figure 15:
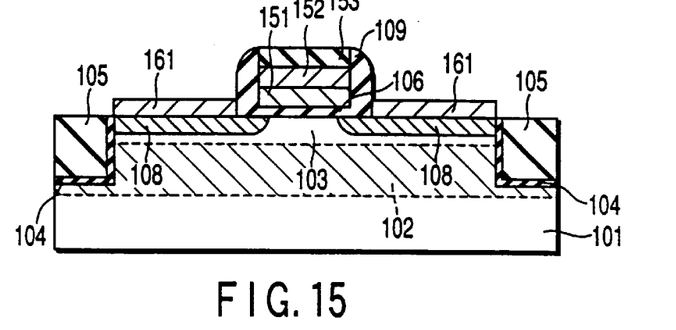
FIG. 15 is a cross sectional view showing the entire construction of a semiconductor device according to a fifth embodiment of the present invention.
Figure 16:
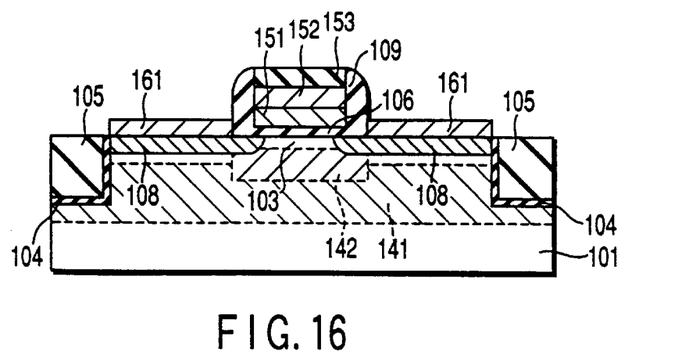
FIG. 16 is a cross sectional view showing the entire construction of a semiconductor device according to a modification of the fifth embodiment of the present invention.

FIGS. 15 and 16 collectively show the entire structure during manufacture of a semiconductor device according to a fifth embodiment of the present invention. The manufacturing process of the semiconductor device according to the fifth embodiment of the present invention is substantially equal to that of the semiconductor device of the first embodiment and, thus, the detailed description of the manufacturing process is omitted concerning the semiconductor device of the fifth embodiment. Incidentally, FIGS. 15 and 16 correspond to the cross sectional view along the line A–A' shown in FIG. 8B.

As shown in FIG. 15, a thin epitaxial silicon layer 161 is formed in the fifth embodiment in a thickness of about 20 nm by a selective epitaxial growing method on the source-drain diffusion layer 108. The source-drain diffusion layer 108 consists of only the diffusion layer 108a formed in the first embodiment, and the diffusion layer 108b is not formed.

How to manufacture the semiconductor device of the fifth embodiment will now be described.

In the first step, source-drain diffusion layers 108a are formed within the epitaxial silicon layer 103 with the gate electrode 107 used as a mask as in the steps up to the step shown in FIG. 7B of the first embodiment. Then, after formation of $n^-$-type source-drain diffusion layers 108 as shown in FIG. 15, an epitaxial silicon layer 161 is formed in an upper portion of the source-drain diffusion layer 108, followed by doping the epitaxial silicon layer 161 with an $n^+$-type impurity.

It should be noted that it is possible to form the epitaxial silicon layer 161 on the source-drain diffusion layer 108, followed by applying an ion implantation to the source-drain diffusion layer 108. Alternatively, it is possible to dope the epitaxial silicon layer 161 with a high concentration of an impurity so as to diffuse again the impurity from the epitaxial silicon layer 161 into the epitaxial silicon layer 103, thereby to forming the diffusion layer 108. Also, in the fifth embodiment, it is possible for the source-drain diffusion layer 108 and the punch-through stopper layer 102 to overlap with each other as in the first embodiment, for these layers 108 and 102 to be positioned apart from each other as shown in FIG. 15. It is also possible to employ a double punch-through stopper structure using the second punch-through stopper layer 142, as shown in FIG. 16.

In the structure of the fifth embodiment, the heat treatment such as the preliminary treatment for removing the native oxide film from the surface of the epitaxial silicon layer 161 is carried out under a hydrogen radical atmosphere before the selective formation of the epitaxial silicon layer 161. In this case, the temperature for the preliminary heat treatment can be lowered to about 700° C., and the epitaxial silicon growth itself can be carried out at about 700° C. As a result, it is possible to suppress the thermal effect given to the impurity re-diffusion of the punch-through stopper layer 102 and the source-drain diffusion layer 108. The thermal effect can also be suppressed in the case where the gate insulating film 106 is formed of a film having a high dielectric constant or where the gate electrode 107 is formed of a metal.

The reason for forming the epitaxial silicon layer 161 as in the fifth embodiment will now be described.

Specifically, it is desirable to form the source-drain diffusion layer 108 as shallow as possible in order to obtain the effect of suppressing the short channel effect of the transistor. However, if the source-drain layer 108 is formed extremely shallow, for example, if the junction depth $X_j$ is about 0.001 µm, a problem is generated that the diffusion resistance of the source-drain is increased. Also, if the source-drain layer 108 is formed extremely shallow, it is difficult to form the silicide film 110 that is formed by self-alignment on the source-drain diffusion layer 108.

Under the circumstances, the diffusion resistance of the source-drain diffusion layer 108 can be lowered by forming the selective epitaxial silicon layer 161 at a low temperature by self-alignment on the source-drain diffusion layer 108 as in the fifth embodiment of the present invention.

It is also possible to form the n$^+$-type source-drain diffusion layer 108b in addition to the source-drain diffusion layer 108a as in the first to fourth embodiments described previously.

Sixth Embodiment

Figure 17A:
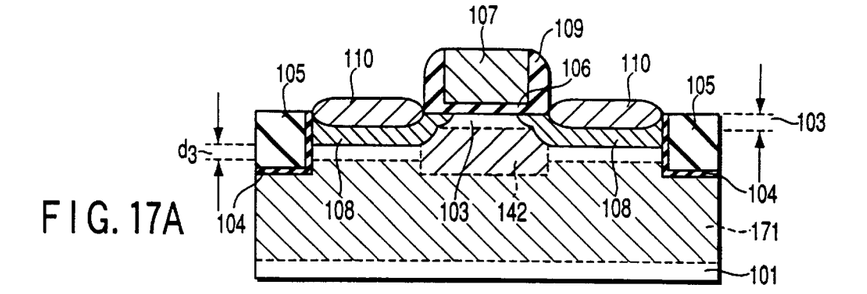
FIGS. 17A and 17B are cross sectional views collectively showing the entire construction of a semiconductor device according to a sixth embodiment of the present invention.
Figure 17B:
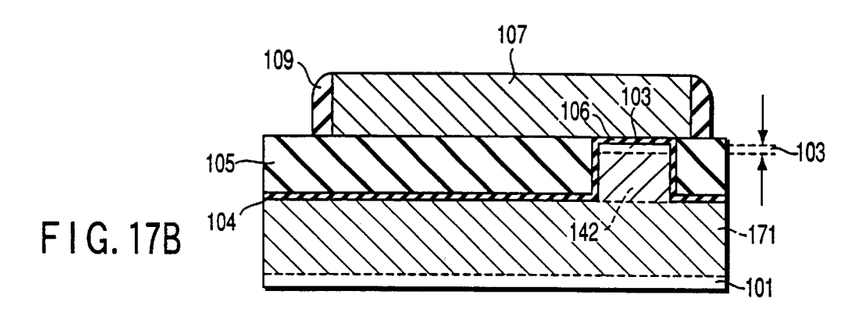

FIGS. 17A and 17B collectively show the entire structure during manufacture of a semiconductor device according to a sixth embodiment of the present invention. The manufacturing process of the semiconductor device according to the sixth embodiment of the present invention is substantially equal to that of the semiconductor device of the first embodiment and, thus, the detailed description of the manufacturing process is omitted concerning the semiconductor device of the sixth embodiment. Incidentally, FIGS. 17A and 17B correspond to the cross sectional view along the line A–A' shown in FIG. 8B.

In the third embodiment described previously, the first and second punch-through stopper layers 141 and 142 are used for separating the source-drain diffusion layer 108 from the punch-through stopper layer. In the third embodiment, the second punch-through stopper layer 142 is used for suppressing the short channel effect so as to prevent the second punch-through stopper layer 142 from being brought into contact with the source-drain diffusion layer with a large contact area.

In the sixth embodiment, however, the first punch-through stopper layer 141 used in the third embodiment is omitted, with the result that the second punch-through stopper layer 142 alone constitutes the punch-through stopper layer. Also, in place of the first punch-through stopper layer, a p-well layer 171 is formed a distance $d_3$ apart from the source-drain diffusion layer 108.

The particular construction of the sixth embodiment described above makes it possible to decrease the current leakage between the source-drain diffusion layer 108 and the silicon substrate 101 and to decrease the area of the second punch-through stopper layer 142 formed before formation of the epitaxial silicon layer 103, with the result that the undoped epitaxial silicon layer 103 can be formed with a high stability.

Seventh Embodiment

Figure 18A:
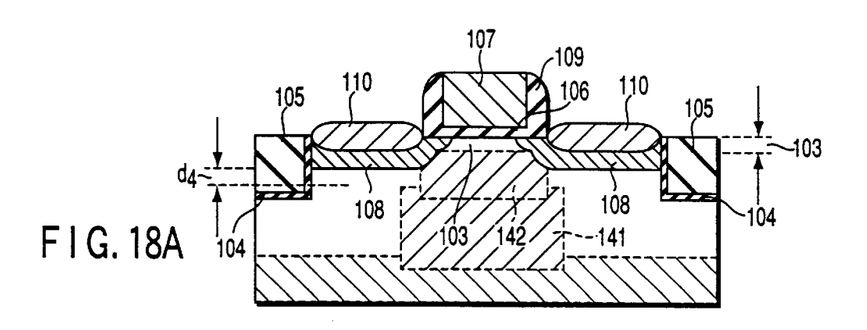
FIGS. 18A and 18B are cross sectional views collectively showing the entire construction of a semiconductor device according to a seventh embodiment of the present invention.
Figure 18B:
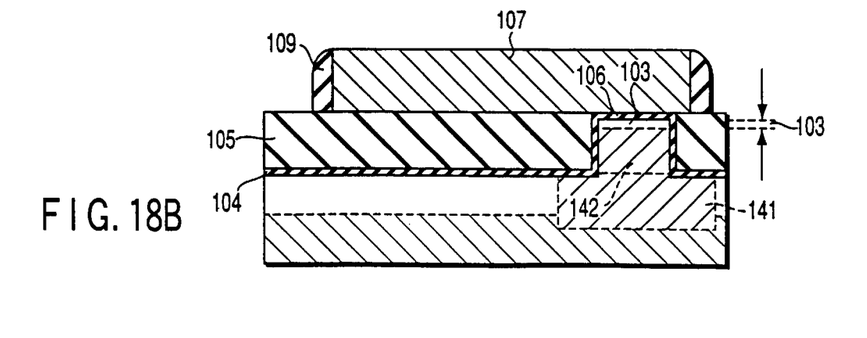

FIGS. 18A and 18B collectively show the entire structure during manufacture of a semiconductor device according to a seventh embodiment of the present invention. The manufacturing process of the semiconductor device according to the seventh embodiment of the present invention is substantially equal to that of the semiconductor device of the first embodiment and, thus, the detailed description of the manufacturing process is omitted concerning the semiconductor device of the seventh embodiment. Incidentally, FIGS. 18A and 18B correspond to the cross sectional view along the line A–A' shown in FIG. 8B.

The semiconductor device of the seventh embodiment is equal to the semiconductor device of the third embodiment in that the punch-through is prevented by the first and second punch-through stopper layers 141 and 142, but differs from the third embodiment in that these stopper layers 141 and 142 are selectively formed in optional shapes in the transistor-forming region. To be more specific, the first and second punch-through stopper layers 141, 142 are formed on the surface and in the vicinity of the surface of the silicon substrate 101. The first punch-through stopper layer 141 is formed in a region deeper than the region in which the second punch-through stopper layer 142 and has an area somewhat larger than the area of the second punch-through stopper layer 142. In addition, the first punch-through stopper layer 141 is formed a vertical distance $d_4$ apart from the source-drain diffusion layer 108.

By using the two punch-through stopper layers 141 and 142 as the punch-through stopper, the distance between the source-drain diffusion layer 108 and the high impurity concentration layer within the silicon substrate 101 can be optionally set while suppressing the punch-through so as to make it possible to lower the current leakage. Also, since the area of the high impurity concentration layer formed within the silicon substrate 101 can be decreased before formation of the epitaxial silicon layer 103, it is possible to form the undoped epitaxial silicon layer 103 with a high stability.

The present invention is not limited to the embodiments described above. For example, each of the embodiments described above is directed to an n-channel transistor. However, it is apparent to those skilled in the art that the technical idea of the present invention can also be applied to a p-channel transistor by interchanging the n-type conductivity and p-type conductivity. It is also possible to form a so-called "CMOS" structure in which n-channel and p-channel transistors are formed within the same chip to allow the CMOS structure to operate as a device having the similar characteristics.

As described above in detail, the present invention provides, a semiconductor device in which the impurity concentration in the channel region in the vicinity of the interface with the gate insulating film is made lower than that in the semiconductor substrate so as to prevent the drain current from being decreased while suppressing the short channel effect. Also, the source-drain region does not extend to overlap with an edge portion of the element isolation region, making it possible to eliminate a semiconductor layer poor in crystallinity from the element isolation region, thereby to low the current leakage.

Also, a low temperature process carried out at a temperature not higher than 700° C. is employed in the method of the present invention for manufacturing a semiconductor device, making it possible to decrease the depth of the source region and the drain region and to suppress the impurity diffusion from the high impurity concentration region formed below the channel region, thereby to maintain a low impurity concentration in the channel region. What should also be noted is that, since the insulating film for element isolation is formed after formation of a high impurity concentration layer, it is possible to obtain a semiconductor device in which the source region and the drain region do not extend to overlap with an edge portion of the element isolation region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate of a first conductivity type;
   a high impurity concentration layer of the first conductivity type formed in at least a part of the semiconductor substrate;
   an epitaxial Si layer of the first conductivity type formed on a main surface of the semiconductor substrate and in contact with the high impurity concentration layer;
   a trench of a predetermined depth, selectively formed in the epitaxial Si layer and the semiconductor substrate;
   an insulating film for element isolation formed in the trench;
   a source region formed in a region where the insulating film for element isolation is not formed; and
   a drain region formed in a region where the insulating film for element isolation is not formed, the epitaxial Si layer being interposed between the source region and the drain region,
   wherein a depth of at least a part of undersurfaces of the source region and the drain region with respect to the main surface of the semiconductor substrate is deeper than a depth of an interface between an undersurface of the epitaxial Si layer and a surface of the high impurity concentration layer with respect to the main surface of the semiconductor substrate.

2. The semiconductor device according to claim 1, further comprising:
   an interlayer insulating film formed on the epitaxial Si layer, the source region and the drain region; and
   a contact formed in the interlayer insulating film and communicating with the source region and the drain region.

3. The semiconductor device according to claim 1, further comprising:
   a silicide film formed on surfaces of the source region and the drain region.

4. The semiconductor device according to claim 1, further comprising:
   a silicide film made of $Pd_2Si$, formed on surfaces of the source region and the drain region.

5. The semiconductor device according to claim 1, further comprising:
   a gate insulating film selectively formed on the epitaxial Si layer;
   a gate electrode formed on the gate insulating film; and
   a silicide film formed on a surface of the gate electrode.

6. The semiconductor device according to claim 1, further comprising:
   a gate insulating film selectively formed on the epitaxial Si layer;
   a gate electrode formed on the gate insulating film; and
   a silicide film made of $Pd_2Si$, formed on a surface of the gate electrode.

7. A semiconductor device, comprising:
   a semiconductor substrate of a first conductivity type;
   a high impurity concentration layer of the first conductivity type formed in at least a part of the semiconductor substrate;
   drain region formed in a region where the insulating film for element isolation is not formed, the epitaxial Si layer being interposed between the source region and the drain region,
   wherein a depth of an undersurface of the first source region with respect to the main surface of the semiconductor substrate is deeper than a depth of an undersurface of the second source region with respect to the main surface of the semiconductor substrate,
   a depth of an undersurface of the first drain region with respect to the main surface of the semiconductor substrate is deeper than a depth of an undersurface of the second drain region with respect to the main surface of the semiconductor substrate, and
   the depth of the undersurfaces of the first source region and the first drain region with respect to the main surface of the semiconductor substrate is deeper than a depth of an interface between an undersurface of the epitaxial Si layer and a surface of the high impurity concentration layer with respect to the main surface of the semiconductor substrate.

8. The semiconductor device according to claim 7, further comprising:
   an interlayer insulating film formed on the epitaxial Si layer, the second source region and the second drain region; and
   a contact formed in the interlayer insulating film and communicating with the second source region and the second drain region.

9. The semiconductor device according to claim 7, further comprising:
   a silicide film formed on surfaces of the second source region and the second drain region.

10. The semiconductor device according to claim 7, further comprising:
    a silicide film made of $Pd_2Si$, formed on surfaces of the second source region and the second drain region.

11. The semiconductor device according to claim 7, further comprising:
    a gate insulating film selectively formed on the epitaxial Si layer;
    a gate electrode formed on the gate insulating film; and
    a silicide film formed on a surface of the gate electrode.

12. The semiconductor device according to claim 7, further comprising:
    a gate insulating film selectively formed on the epitaxial Si layer;
    a gate electrode formed on the gate insulating film; and
    a silicide film made of $Pd_2Si$, formed on a surface of the gate electrode.

* * * * *